US009893167B2

(12) United States Patent
Kim et al.

(10) Patent No.: US 9,893,167 B2
(45) Date of Patent: Feb. 13, 2018

(54) INTEGRATION METHODS TO FABRICATE INTERNAL SPACERS FOR NANOWIRE DEVICES

(71) Applicant: Intel Corporation, Santa Clara, CA (US)

(72) Inventors: Seiyon Kim, Portland, OR (US); Daniel A. Simon, Hillsboro, OR (US); Kelin J. Kuhn, Aloha, OR (US); Curtis W. Ward, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/118,838

(22) PCT Filed: Mar. 24, 2014

(86) PCT No.: PCT/US2014/031632
§ 371 (c)(1),
(2) Date: Aug. 12, 2016

(87) PCT Pub. No.: WO2015/147792
PCT Pub. Date: Oct. 1, 2015

(65) Prior Publication Data
US 2017/0053998 A1    Feb. 23, 2017

(51) Int. Cl.
H01L 29/06    (2006.01)
H01L 29/423   (2006.01)
(Continued)

(52) U.S. Cl.
CPC ...... H01L 29/66553 (2013.01); H01L 21/764 (2013.01); H01L 29/0673 (2013.01);
(Continued)

(58) Field of Classification Search
CPC .......... H01L 29/66553; H01L 29/0673; H01L 29/42392; H01L 29/66742; H01L 29/78696; H01L 21/02603; H01L 29/7831
See application file for complete search history.

(56) References Cited

U.S. PATENT DOCUMENTS 6,121,340 A      9/2000  Shick et al.
9,136,486 B2 *   9/2015  Suzuki ................ C08G 77/045
(Continued)

FOREIGN PATENT DOCUMENTS

WO    WO 2013/095647 A1    6/2013
WO    WO 2014/018201 A1    1/2014

OTHER PUBLICATIONS

Notice of Allowance from Taiwan Patent Office dated Sep. 23, 2016 for Taiwan Patent Application No. 104104751 (2 pages).
(Continued)

Primary Examiner — Jose R Diaz
(74) Attorney, Agent, or Firm — Schwabe Williamson & Wyatt P.C.

(57) ABSTRACT

A nanowire device having a plurality of internal spacers and a method for forming said internal spacers are disclosed. In an embodiment, a semiconductor device comprises a nanowire stack disposed above a substrate, the nanowire stack having a plurality of vertically-stacked nanowires, a gate structure wrapped around each of the plurality of nanowires, defining a channel region of the device, the gate structure having gate sidewalls, a pair of source/drain regions on opposite sides of the channel region; and an internal spacer on a portion of the gate sidewall between two adjacent nanowires, internal to the nanowire stack. In an embodiment, the internal spacers are formed by depositing photo-definable spacer material in dimples etched adjacent to the channel region. Photo-definable material remains in the dimples by altering the etch characteristics of material (Continued)

outside of the dimples and selectively removing altered photo-definable material outside of the dimples.

30 Claims, 11 Drawing Sheets

(51) Int. Cl.
    *H01L 29/66*     (2006.01)
    *H01L 21/764*     (2006.01)
    *H01L 29/786*     (2006.01)

(52) U.S. Cl.
    CPC .. *H01L 29/42392* (2013.01); *H01L 29/66545* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,484,447 B2 * | 11/2016 | Kim | .......... H01L 29/0673 |
| 2010/0059807 A1 | 3/2010 | Cho et al. | |
| 2011/0281412 A1 | 11/2011 | Ernst et al. | |
| 2013/0153996 A1 | 6/2013 | Chang et al. | |
| 2013/0187229 A1 | 7/2013 | Cheng et al. | |
| 2013/0279145 A1 | 10/2013 | Then et al. | |
| 2014/0001441 A1 | 1/2014 | Kim et al. | |

OTHER PUBLICATIONS

Office Action including Search Report (4 pages) dated Apr. 8, 2016 issued by the Examiner of the Intellectual Property Office (the IPO) for Taiwan Patent Application No. 104104751 and English Translation (4 pages) thereof.

Notification Concerning Transmittal of International Preliminary Report on Patentability for PCT/US2014/031632 filed Mar. 24, 2014 dated Oct. 6, 2016 (6 pages).

Notification of Transmittal of the International Search Report and the Written Opinion of the International Searching Authority for PCT/US2014/031632 filed Mar. 24, 2014 dated Dec. 22, 2014, 9 pages.

Search Report for European Application No. 14886962.1, dated Nov. 21, 2017, 10 pgs.

\* cited by examiner

INTEGRATION METHODS TO FABRICATE INTERNAL SPACERS FOR NANOWIRE DEVICES

This patent application is a U.S. National Phase Application under 35 U.S.C. 371 of International Application No. PCT/US2014/031632 filed Mar. 24, 2014.

BACKGROUND

As integrated device manufacturers continue to shrink the feature sizes of transistor devices to achieve greater circuit density and higher performance, there is a need to manage transistor drive currents while reducing short-channel effects, parasitic capacitance and off-state leakage in next-generation devices. Non-planar transistors, such as fin and nanowire-based devices, enable improved control of short channel effects. For example, in nanowire-based transistors the gate stack wraps around the full perimeter of the nanowire, enabling fuller depletion in the channel region, and reducing short-channel effects due to steeper sub-threshold current swing (SS) and smaller drain induced barrier lowering (DIBL). Wrap-around gate structures and source/drain contacts used in nanowire devices also enable greater management of leakage and capacitance in the active regions, even as drive currents increase.

DETAILED DESCRIPTION

Figure 1A:
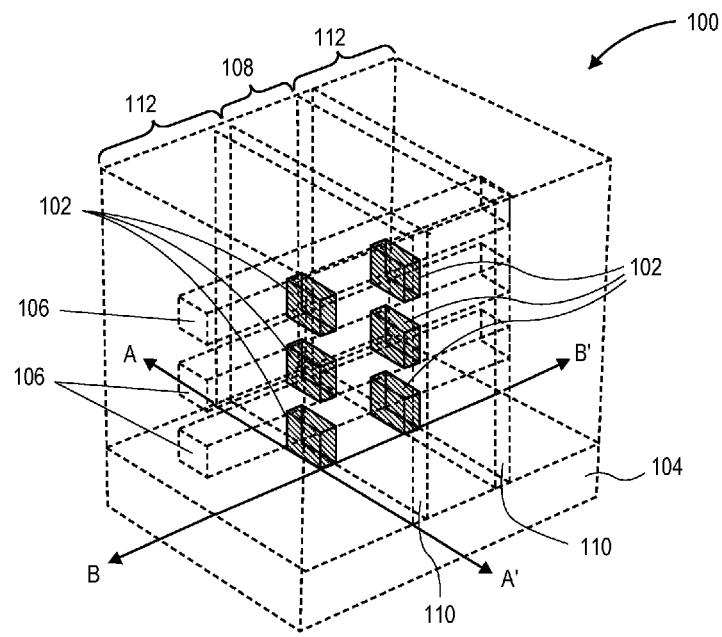
FIG. 1A illustrates an isometric view of a nanowire device having a plurality of internal spacers according to an embodiment of the invention.

A method to fabricate internal spacers for nanowire transistors is described. Embodiments of the present invention have been described with respect to specific details in order to provide a thorough understanding of embodiments of the invention. One of ordinary skill in the art will appreciate that embodiments of the invention can be practiced without these specific details. In other instances, well known semiconductor processes and equipment have not been described in specific detail in order to not unnecessarily obscure embodiments of the present invention. Additionally, the various embodiments shown in the figures are illustrative representations and are not necessarily drawn to scale.

Embodiments of the invention describe a method for forming internal spacers of a nanowire transistor by depositing spacer material in dimples formed adjacent to a channel region, where the dimples are formed by etching from a source/drain region. In an embodiment, a preliminary structure is initially provided on a substrate. The preliminary structure includes a nanowire stack, a gate structure defining a channel region within the nanowire stack, a pair of source/drain regions disposed on opposite sides of the channel region, and a pair of external gate sidewall spacers on opposite sides of the gate structure. Within the source/drain regions, the nanowire stack includes alternating layers of nanowire material and sacrificial material. The sacrificial material between the nanowires is then removed from the source/drain region, creating a dimple that exposes a side surface of the channel region. Next, a photo-definable spacer material is spin-coated over the exposed surfaces to fill the dimple as well as spaces between the nanowires. Thereafter, the photo-definable spacer material outside of the dimple may then be transformed to alter its solubility by exposure to electromagnetic radiation or particle beam. The transformed spacer material is then selectively removed so that un-transformed spacer material remains within the dimples. Finally, the spacer material located within the dimple regions is cured to remain as an internal spacer structure.

Additionally, embodiments of the invention describe a method for forming internal spacers by depositing spacer material in dimples formed adjacent to the channel region, where the dimples are formed by etching from a channel region. In an embodiment, a preliminary structure is initially provided on a substrate. The preliminary structure includes a nanowire stack of alternating nanowire and sacrificial material layers, a sacrificial gate structure defining a channel region within the nanowire stack, a pair of external gate sidewall spacers on opposite sides of the sacrificial gate structure, and a pair of source/drain regions on opposite sides of the channel region. The sacrificial gate structure is then removed to expose the nanowire stack in the channel region. Next, the sacrificial material is removed from between adjacent nanowires, to expose the full perimeter of each nanowire within the channel region. The sacrificial material is etched out of the channel region and a portion of the source/drain region such that dimples are created in a portion of the source/drain regions. Thereafter, a photo-definable spacer material is spin-coated on the surfaces exposed by the opened channel region, such that it fills the channel region and the dimples formed in a portion of the source/drain region. The photo-definable spacer material within the channel region and outside of the dimples is then transformed to alter its solubility by exposure to electromagnetic radiation or particle beam. Next, the transformed spacer material is selectively removed so that un-transformed spacer material remains within the dimples. Finally, the spacer material located within the dimple regions is cured to remain as an internal spacer structure.

A functional gate structure may be formed within the channel region, wrapping around the portion of each nanowire within the channel region and contacting the internal spacers. In addition, source/drain contacts may be formed in the source/drain region. The internal spacers improve isolation of the gate structure from the source/drain region, reducing overlap capacitance.

Figure 1B:
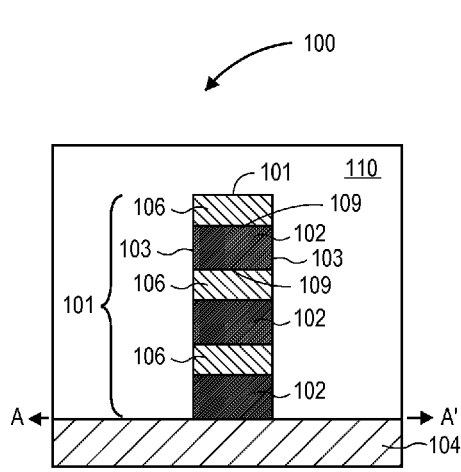
FIG. 1B illustrates a two-dimensional cross-sectional view of a nanowire device having a plurality of internal spacers according to an embodiment of the invention.
Figure 1C:
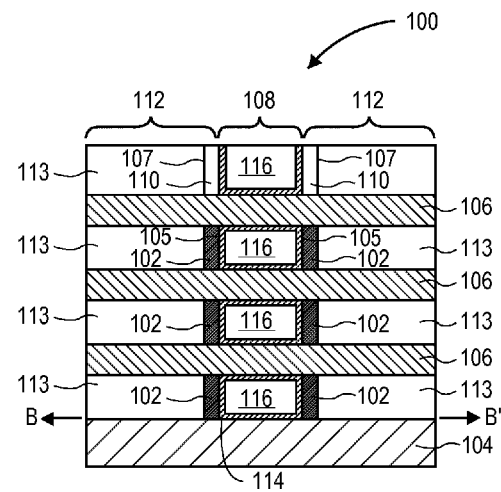
FIG. 1C illustrates a two-dimensional cross-sectional view of a nanowire device having a plurality of internal spacers according to an embodiment of the invention.

FIGS. 1A-1C illustrate a nanowire transistor configured with internal gate sidewall spacers, according to an embodiment of the invention. Components of nanowire transistor 100 that are illustrated in FIGS. 1B and 1C are either omitted or represented by dashed lines in FIG. 1A in order to clearly illustrate the placement of internal spacers 102. Referring now to FIG. 1A, an isometric view of a portion of a nanowire transistor 100 having internal gate sidewall spacers 102 is illustrated, according to an embodiment of the invention. Internal spacers 102 are positioned within the source/drain region 112 of device 100, adjacent to the channel region 108, between adjacent nanowires 106, and further defined by external sidewall spacer 110. In an embodiment, another pair of internal spacers 102 are positioned within the source/drain region 112 of device 100, adjacent to the channel region 108, between the bottommost nanowire 106 and substrate 104, and further defined by external sidewall spacer 110.

Illustrated in the cross-sectional view shown by an embodiment in FIG. 1B, nanowire transistor 100 features a plurality of nanowires 106, disposed above a substrate 104 in a vertical nanowire stack 101. The cross-section of FIG. 1B is taken along the line A-A' of the nanowire device 100 in FIG. 1A. The nanowire stack 101 has an internal region and an external region. In an embodiment, the internal region contains the nanowires 106 and the materials and/or volume between the nanowires 106. In an embodiment, the internal region also contains the materials and/or volume between the bottommost nanowire and the substrate 104. In an embodiment, the external region contains all materials and/or volume not contained within the internal region.

Substrate 104 may be composed of a material suitable for semiconductor device fabrication. In one embodiment, the structure is formed using a bulk semiconductor substrate. Substrate 104 may include, but is not limited to, silicon, germanium, silicon-germanium, or a III-V compound semiconductor material. In another embodiment, the substrate 104 is a silicon-on-insulator (SOI) substrate. An SOI substrate includes a lower bulk substrate, a middle insulator layer disposed on the lower bulk substrate, and a top monocrystalline layer. The middle insulator layer may comprise silicon dioxide, silicon nitride, or silicon oxynitride. The top single crystalline layer may be any suitable semiconductor material, such as those listed above for a bulk substrate.

In an embodiment, nanowires 106 are formed from a semiconductor material. In one such embodiment, nanowires 106 are single-crystalline and have a lattice constant. Nanowires 106 may be a material such as, but not limited to, silicon, germanium, SiGe, GaAs, InSb, GaP, GaSb, InAlAs, InGaAs, GaSbP, GaAsSb, and InP. In a specific embodiment, nanowires 106 are silicon. In another specific embodiment, nanowires 106 are germanium. In an embodiment, the nanowires 106 comprise a stressed material, particularly the channel portion of nanowires 106 within channel region 108 of device 100. In an embodiment, nanowires 106 have source/drain portions in source/drain regions 112 of device 100.

As illustrated in FIG. 1C, channel region 108 of the device 100 is defined by a gate structure, which wraps around the perimeter of each nanowire 106, according to an embodiment of the invention. The cross-section of FIG. 1C is taken along the line B-B' of the nanowire device 100 in FIG. 1A. In FIG. 1C, the gate structure comprises a gate dielectric layer 114 in contact with the full perimeter of the channel portions of the nanowires 106, and a gate electrode 116 wrapping around the gate dielectric layer 114, according to an embodiment of the present invention. In an embodiment, gate dielectric layer 114 is composed of a high-k dielectric material. For example, in one embodiment, the gate dielectric layer 114 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In an embodiment, gate dielectric layer 114 is from 10 to 60 Å thick.

In an embodiment, gate electrode 116 is composed of a metal layer such as, but not limited to, metal nitrides, metal carbides, metal silicides, metal aluminides, hafnium, zirconium, titanium, tantalum, aluminum, ruthenium, palladium, cobalt, or nickel. In a specific embodiment, the gate electrode is composed of a conductive non-workfunction-setting fill material formed above a workfunction-setting layer. In an embodiment, gate electrode 116 comprises a p-type work function metal or metal compound. In another embodiment, gate electrode 116 comprises an n-type work function metal or metal compound.

A pair of source/drain regions 112 are disposed on opposite sides of the channel region 108, according to an embodiment. In an embodiment, a pair of external gate sidewall spacers 110 are formed on the portion of the gate structure sidewalls external to the nanowire stack, one within each of the source/drain regions 112. The thickness and material of the external sidewall spacer 110 may be selected to offset doping of the source/drain portions of nanowires 106, to minimize overlap capacitance between the portions of channel region 108 and source/drain region 112 external to the nanowire stack, to reduce device leakage, and to reduce the risk of shorting between the gate electrode and the source/drain contacts. Sidewall spacers 110 may be composed of an insulative dielectric material such as, but not limited to, silicon dioxide, silicon oxy-nitride, or silicon nitride. External sidewall spacers 110 may be 20 to 100 Å thick.

Internal sidewall spacers 102 are adjacent to the gate structure, within the source/drain region 112 and between adjacent nanowires 106, according to an embodiment of the invention. With brief reference to FIG. 1B, in an embodiment, internal sidewall spacers 102 are defined by two opposing surfaces 109 of adjacent nanowires 106, and two opposing surfaces 103 of external sidewall spacers 110. Referring back to FIG. 1C, internal sidewall spacers 102 are further defined by channel region 108, as defined by the surface of the gate structure, according to an embodiment. In an embodiment, internal sidewall spacers 102 are aligned with surface 107 of external sidewall spacer 110. In an embodiment, internal sidewall spacers 102 are a cross-linked photo-definable dielectric material. Additionally, the internal sidewall spacers may be of the same or different thickness as the external sidewall spacers 110, such as from 20 to 100 Å.

In an embodiment, the internal sidewall spacers 102 protect against shorting and leakage, and reduce overlap capacitance between the gate structure and conductive or semiconductive material 113 in the internal region of the nanowire stack within the source/drain regions 112 of device 100. For example, where material 113 is a metal source/drain contact, wrapping around the source/drain portions of nanowires 106, internal spacers reduce capacitance between the portions of the gate electrode 116 and the metal source/drain contacts 113 that are internal to the nanowire stack. Material 113 may also be a semiconductive material. The internal sidewall spacers 102 may be formed of a cross-linked photo-definable dielectric material.

Figure 1D:
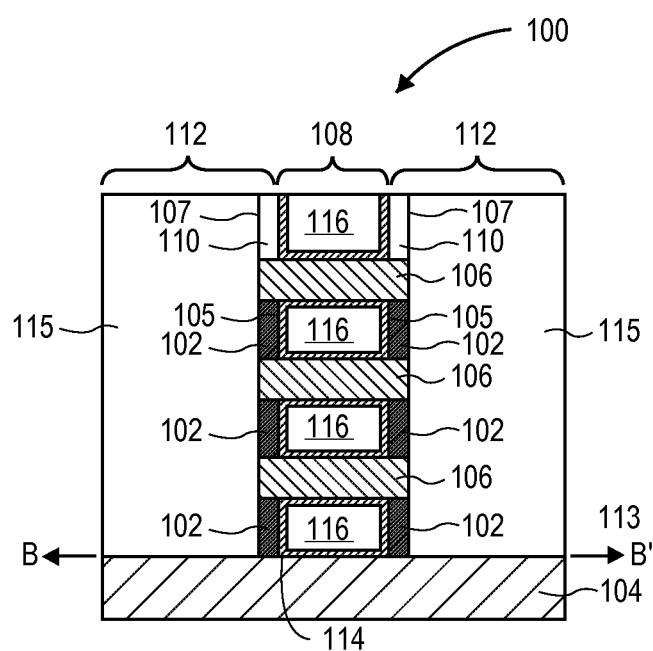
FIG. 1D illustrates a two-dimensional cross-sectional view of a nanowire device having a plurality of internal spacers and homogenous source and drain portions according to an embodiment of the invention.

In an embodiment depicted in FIG. 1D, source/drain regions 112 comprise homogeneous source and drain portions 115. In a specific embodiment, homogeneous source/drain portions 115 are in electrical contact with the channel portions of each nanowire 106. In an embodiment, homogeneous source and drain portions 115 may be doped or undoped semiconductor material. In another specific embodiment, homogeneous source/drain portions 115 are a metal species. In an embodiment, a portion of nanowires 106 remains in the source/drain region 112, such as between internal spacers 102, as shown in FIG. 1D. In another embodiment, all of the source/drain portions of nanowires 106 have been removed, such that nanowires 106 are only within the channel region 108.

In yet other example embodiments, the bottommost nanowire 106 in the nanowire stack rests on the top surface of a semiconductor fin extending from the substrate 104, forming a tri-gate device. In such an embodiment, the gate structure does not wrap around the full perimeter of the bottommost nanowire 106. In an embodiment where there is no gate portion below the bottommost nanowire and internal to the nanowire stack, internal spacers are not required below the bottommost nanowire to isolate the gate stack from materials in the source/drain region of the device.

FIGS. 2A-2H are cross-sectional views illustrating a method for forming a nanowire transistor configured with internal spacers by opening the source/drain region of the device, according to an embodiment of the invention. Each figure illustrates two alternate cross-sectional views of the partially-formed nanowire transistor 200: one on the left taken through the source/drain region of the device, and one on the right taken parallel to nanowires 206. The location of the source/drain cross-sectional left-hand view is illustrated by a dotted line in the right hand view.

Figures 1, 2A:
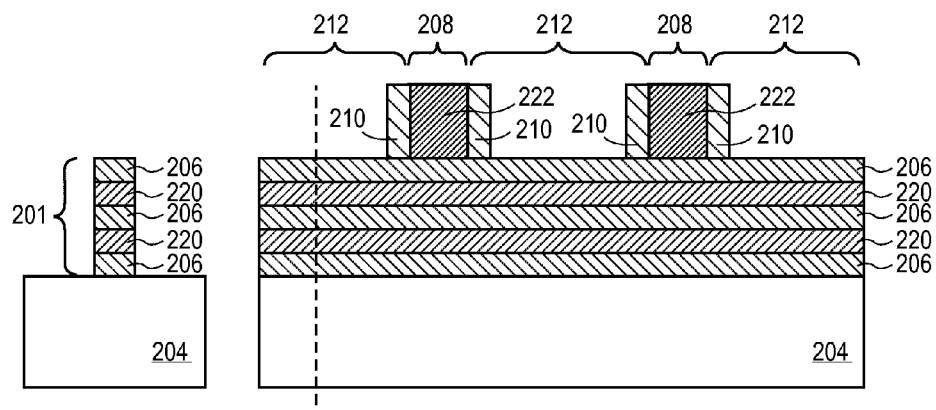
FIGS. 2A-2H illustrate two-dimensional cross-sectional views of a method for forming a nanowire device having internal spacers according to an embodiment of the invention.

In FIG. 2A-1, a structure having a nanowire stack 201 disposed on a substrate 204 and two gate structures 222, each defining a channel region 208 within the nanowire stack 201 is provided. Source/drain regions 212 of the device 200 are disposed on opposite sides of each channel region 208. External gate spacers 210 are disposed directly adjacent to the gate structure 222 within the source/drain regions 212.

The nanowire stack 201 comprises nanowires 206 and sacrificial material 220. The volume within nanowires 206 and sacrificial material 220 is internal to nanowire stack 201, while volume outside nanowires 206 and sacrificial material 220 is external to nanowire stack 201. In an embodiment, sacrificial material 220 and nanowires 206 are both single-crystalline semiconductor materials. The sacrificial material 220 may be any single-crystalline semiconductor material that can be etched selective to nanowires 206. Nanowires 206 and sacrificial material 220 may each be a semiconductor material such as, but not limited to, silicon, germanium, SiGe, GaAs, InSb, GaP, GaSb, InAlAs, InGaAs, GaSbP, GaAsSb, and InP. In a specific embodiment, nanowires 206 are silicon and sacrificial material 220 is SiGe. In another specific embodiment, nanowires 206 are germanium, and sacrificial material 220 is SiGe. In an embodiment, sacrificial material 220 is formed to a thickness sufficient to create a desired amount of strain in nanowires 206.

The nanowire stack 201 may be formed by suitable deposition and etch techniques well known in the art. For example, in an embodiment, the nanowires 206 and sacrificial material 220 within the nanowire stack 201 are epitaxially deposited one upon the other in an alternating arrangement. The deposition results in a vertical stack of alternating layers of nanowire 206 and sacrificial material 220. Thereafter, the alternating layers of nanowires 206 and sacrificial material 220 may be etched to form a fin-type structure (nanowire stack 201) with any suitable mask and plasma etch process.

The gate structures 222 may be functional or sacrificial. In the example embodiment illustrated in FIG. 2A-1, gate structures 222 are sacrificial, wrapping around nanowire stack 201. Gate structure 222 may be any suitable material, such as polysilicon. In another embodiment, the gate structures are functional and each comprises a gate dielectric layer and a gate electrode that wrap around the channel portions of nanowires 206. Functional gate materials are discussed above.

External gate sidewall spacers 210 are formed directly adjacent to the gate structure 222 and external to the nanowire stack 201, according to an embodiment of the invention. External sidewall spacers 210 may be formed using conventional methods of forming spacers known in the art. External sidewall spacers 210 may be any suitable dielectric material such as, but not limited to, silicon oxide, silicon nitride, silicon oxynitride and combinations thereof. In an embodiment, external sidewall spacers 210 are formed with an opaque dielectric material that can absorb light to prevent light from passing through the external sidewall spacers 210. It is to be appreciated that embodiments are not limited to absorption of only visible light, but rather any form of electromagnetic radiation such as, but not limited to, ultraviolet light (including deep ultraviolet light (DUV)), or any form of particle beam, such as, but not limited to, ion beam and electron beam. Some suitable opaque dielectric materials include nitrides and carbides like silicon nitride or silicon carbide. In some embodiments, external sidewall spacers 210 are from 20 to 100 Å thick.

Figures 2, 2A:
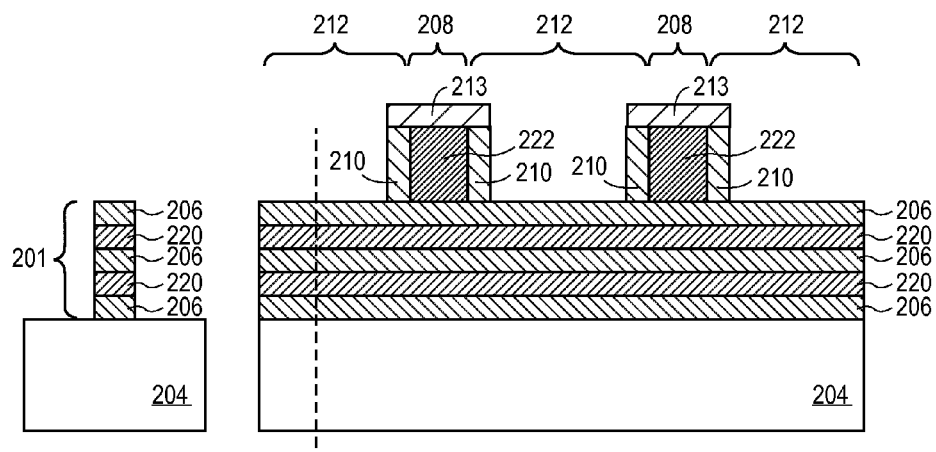

In an alternative embodiment depicted in FIG. 2A-2, a reflective or opaque mask 213 is formed over the external spacers 210 and gate structures 222 to prevent light from entering the external spacers 210. In this case, the external spacer 210 may be formed with any suitable dielectric material, opaque or transparent, such as silicon dioxide. The reflective or opaque mask 213 may be formed by any suitable material that can absorb or reflect light to prevent light from entering the external gate spacer 210. In an embodiment, the mask 213 is formed from titanium nitride. In an embodiment, the mask 213 and the external spacers 210 are both formed from opaque materials to prevent light from passing through the external spacers 210. In an embodiment, the mask 213 is formed from a reflective material and the external spacers 210 are formed from an opaque dielectric material. The mask 213 can be formed by any suitable method well known in the art. For example, the mask 213 can be formed by any conventional deposition and etch technique. In another example, the mask 213 can be formed by a selective growth technique where vertical growth is preferentially grown over lateral growth.

Figure 2B:
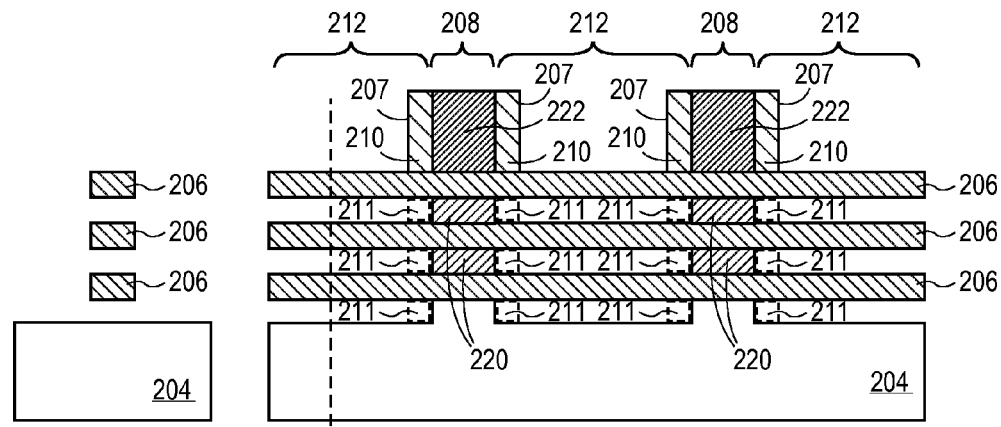

In FIG. 2B, sacrificial material 220 within the source/drain regions 212 of the device 200 is removed from between nanowires 206, according to an embodiment of the invention. In an embodiment, sacrificial material 220 is removed up to the edge of the channel region 208, creating a plurality of dimple volumes 211. In an embodiment, dimple volumes 211 are defined by the surfaces of the two adjacent nanowires 206, the interface of the internal and external regions of the nanowire stack 201, and the edge of the channel region 208. In an embodiment, external sidewall spacer 210 wraps around nanowire stack 201 at the interface of the internal and external regions of the nanowire stack, in contact with dimple volumes 211.

Sacrificial material 220 may be removed using any known etchant that is selective to nanowires 206. In an embodiment, sacrificial material 220 is removed by a timed wet etch process, timed so as to undercut the external sidewall spacers 210. In an embodiment, the selectivity requirement of the etchant is greater than 50:1 for sacrificial material over nanowire material. In an embodiment, the selectivity is greater than 100:1. In an embodiment where nanowires 206 are silicon and sacrificial material 220 is silicon germanium, sacrificial material 220 is selectively removed using a wet etchant such as, but not limited to, aqueous carboxylic acid/nitric acid/HF solution and aqueous citric acid/nitric acid/HF solution. In an embodiment where nanowires 206 are germanium and sacrificial material 220 is silicon germanium, sacrificial material 220 is selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. In another embodiment, sacrificial material 220 is removed by a combination of wet and dry etch processes.

In addition, the substrate 204 material below the bottommost nanowire 206 in the nanowire stack 201 may optionally be removed to expose the full perimeter of the bottommost nanowire 206, in which case the dimple volume 211 is defined by the bottommost nanowire 206, the edge of the channel region 208, and the substrate 204. Substrate 204 may be etched by known processes selective to the substrate material over the nanowire material.

Figure 2C:
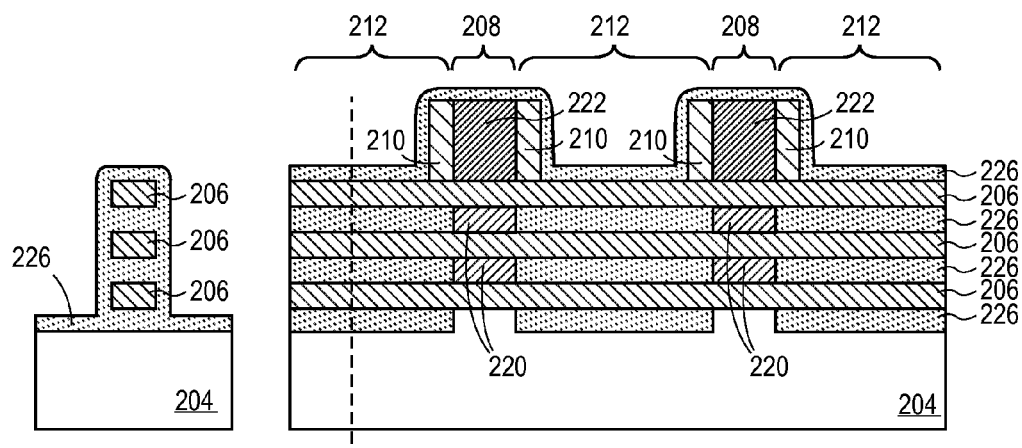

Next, in an embodiment illustrated in FIG. 2C, spacer material 226 is formed over the exposed surfaces within the source/drain region, such that it fills the dimple volumes 211 and the spaces between adjacent nanowires 206. According to an embodiment of the invention, spacer material 226 is formed from a photo-definable dielectric material (PDDM). The PDDM can be any positive-tone resist that transforms etch characteristics when chemically modified by exposure to electromagnetic radiation or particle beam. In an embodiment, the chemical modification is an ionization of the PDDM material from exposure to the electromagnetic radiation or particle beam. For example, the PDDM may be any Si—O—R based polymer (where R indicates organic functional group(s)). In an embodiment, the photo-definable dielectric material (PDDM) also includes additives which enable photo-definability. The PDDM and additive combined are soluble in a casting solution. In an embodiment, the PDDM is a silsesquioxane (SSQ)-based polymer with a photoacid generator (PAG) additive, such as, but not limited to, tri-phenylsulfonium (TPS) triflate, TPS nonaflate, or any other industry standard PAG. Simple resist quenchers (e.g. tertiary amines like tetra ethylamine) can also be used along with the PAG to optimize exposure latitude and chemical contrast. Alternatively, in an embodiment, the PDDM is an SSQ-based polymer with a photo-destructive base additive. The photo-destructive base may comprise the conjugate base of an organic acid as the anion coupled with a photoactive cation. TPS may be used as the photoactive cation along with an anion that functions as an organic base. Example anions may include compounds with deprotenated carboxylic or sulfonic acid functional groups. Additionally, these anions can contain amine or alcohol functional groups to increase basicity. The mixture of PDDM polymer plus additives as cast have a baseline polarity, which may be altered when chemically modified by photon or ion beam exposure. This polarity modification may impact the dissolution rate in the PDDM developer liquid. In an embodiment, spacer material 226 is a low-k dielectric material, i.e., having a dielectric constant less than 3.6. Furthermore, in an embodiment, spacer material 226 has a low molecular weight, such as a molecular weight of less than 7 kD, to allow sufficient gap fill within the dimple 211. In a particular embodiment, spacer material 226 has a molecular weight of less than 5 kD. Prior to forming the spacer material 226, an optional wetting process may be performed to have better conformity of the spacer material 226. The spacer material 226 may then be formed with a wet deposition process such as a spin-on deposition process. Thereafter, a post-apply bake may be performed at a temperature ranging from 80 to 250° C. The post-apply bake drives out solvents in the casting solution that were used for the spin-on deposition process of the PDDM. Temperature exposure greater than 250° C. are avoided at this point to avert curing of the spacer material 226.

Figure 2D:
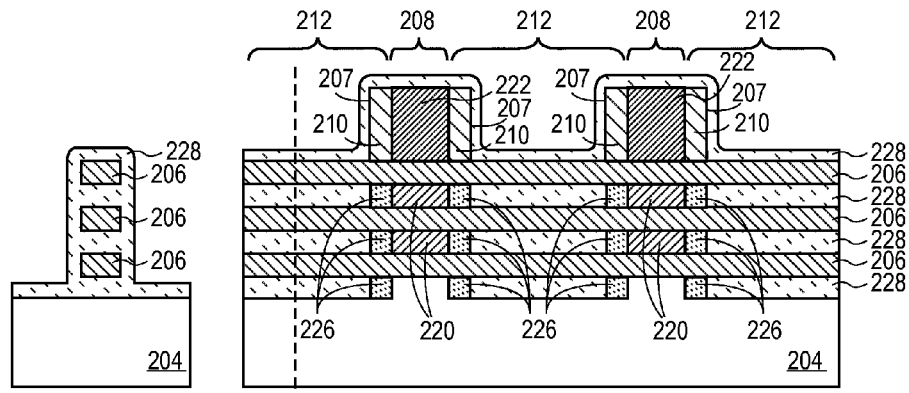

Next, as illustrated in FIG. 2D, the spacer material 226 deposited outside the dimple volume 211 may be transformed into transformed spacer material 228. In an embodiment, transformed spacer material 228 has a different molecular polarity than spacer material 226. By altering the molecular polarity of the spacer material 226, the transformation also alters the etch characteristics of the transformed spacer material 228. As such, the developing process used to remove excess spacer material from outside the dimple 211 is more easily controlled. Transformation may occur by chemical modification from exposure to any form of electromagnetic radiation, such as, but not limited to, visible light, UV light (including DUV light), or any form of particle beam, such as, but not limited to, ion beam and electron beam. In an embodiment, the chemical modification is an ionization of the spacer material 226 by the exposure to electromagnetic radiation or particle beam. In an embodiment, transformation is performed by a flood exposure of DUV light with a wavelength of 172 nm, 193 nm, or 248 nm. When the photo-definable spacer material 226 is exposed to electromagnetic radiation, the polarity of the PDDM spacer material 226 is changed to form a more soluble structure. In an embodiment, the transformed spacer material 228 becomes soluble in a developer solution while the un-transformed spacer material 226 remains insoluble in the developer solution. As such, the altered molecular polarity of the transformed spacer material 228 enables it to be removed selective to the un-transformed spacer material 226 located within the dimple volumes 211.

In an embodiment, external gate sidewall spacers 210, or optional opaque/reflective mask 213 from FIG. 2A-2, completely protect the spacer material 226 within the dimple volumes 211 from exposure to electromagnetic radiation or particle beam. In an embodiment, insufficient electromagnetic radiation or particle beam passes through the external gate sidewall spacers 210 or optional opaque/reflective mask 213 to transform the PDDM 226. As such, the transformation is self-aligned to prevent the spacer material 226 within the dimple volumes 211 from exposure. For example, the external gate spacers 210 may be formed from an opaque material that absorbs electromagnetic radiation. Accordingly, the external gate spacers 210 protect the spacer material 226 from exposure to electromagnetic radiation. Alternatively, the optional mask 213 constructed from opaque or reflective material may be formed on top of the gate spacer to prevent exposure of the spacer material 226 to electromagnetic radiation and/or particle beam. The transformation process is sufficient to alter the etch selectivity of the spacer material 228 outside of the dimple volumes 211, but does not affect mobility or degrade performance of the nanowires 206 within the source/drain regions 212. It is to be appreciated that the photon or ion beam exposure may not occur only at normal incidence to the substrate 204. The illumination incidence may also occur at angles perpendicular to the external gate spacer 210, but with an altitudinal angle sufficient to expose the regions underneath the nanowires 206 to allow transformation of spacer material 226 underneath the nanowires 206. Using electromagnetic radiation or particle beam to transform spacer material 226 has better directionality than other methods such as plasma treatment and oxidation, allowing for more control over the dimensions of the transformation areas.

Figure 2E:
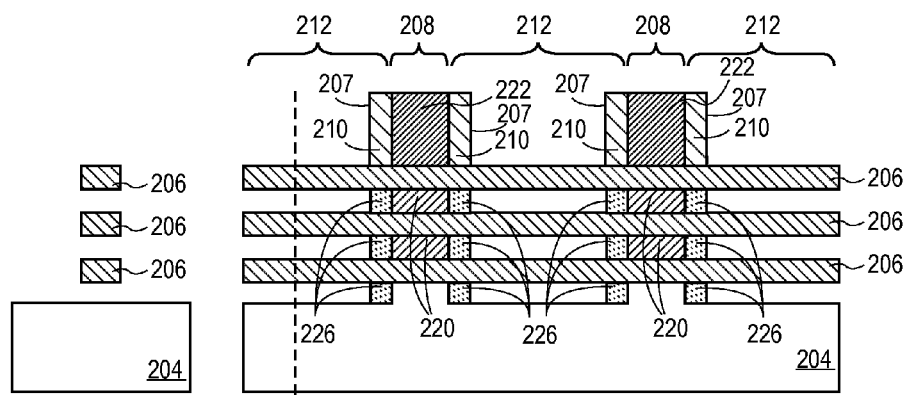

Thereafter, as shown in FIG. 2E, the transformed spacer material 228 outside of the dimple volumes is removed from the portion of the source/drain region 212; the dimple volumes retain un-transformed spacer material 226. In an embodiment, the transformed spacer material 228 may be removed by a wet-etch process with a developer selective to un-transformed spacer material 226. For example, a transformed spacer material 228 made from SSQ with a PAG additive may be removed selective to the un-transformed spacer material 228 by a polar organic solvent or an aqueous base. Example polar organic solvents include primary alcohols, such as ethanol, IPA, or butanol, or secondary alcohols, such as methyl isobutyl carbinol or di-isoamyl ether. Example aqueous base solvents include tetra-methyl ammonium hydroxide (TMAH) or dilute ammonia at various concentrations. In an alternative embodiment, a transformed spacer material 228 made from SSQ and a photo-destructive base additive may be selectively removed by a TMAH or an HF based developer. The alteration of spacer molecules following transformation increases its solubility, enabling the developer to selectively remove the transformed spacer material 228 while leaving the un-transformed spacer material 226 substantially intact.

Figure 2F:
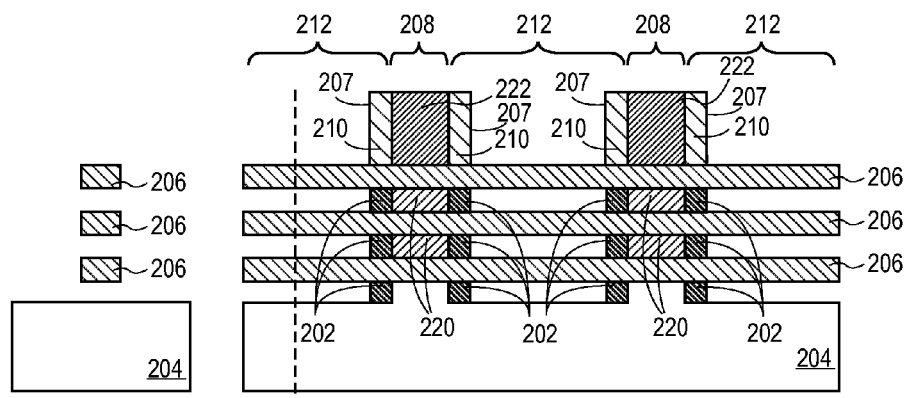

Next, as shown in FIG. 2F, the remaining un-transformed spacer material 226 may be cured to form an internal spacer 202. In an embodiment, curing of the spacer material 226 cross-links the photo-definable dielectric material and increases its molecular weight. As such, the cross-linked photo-definable dielectric material may remain as the internal spacer 202. In an embodiment, curing the spacer material 226 is performed by thermal treatment at a high temperature. For example, the spacer material 226 is cured at a temperature greater than 250° C. In a particular embodiment, the curing temperature is between 350 and 450° C. In an embodiment, ultraviolet (UV) light or ion beam is introduced in the curing process (at non-normal incident angles) to aid in cross-linking the photo-definable dielectric material. With the addition of UV light or ion beam, the curing temperature may be reduced.

Figure 2G:
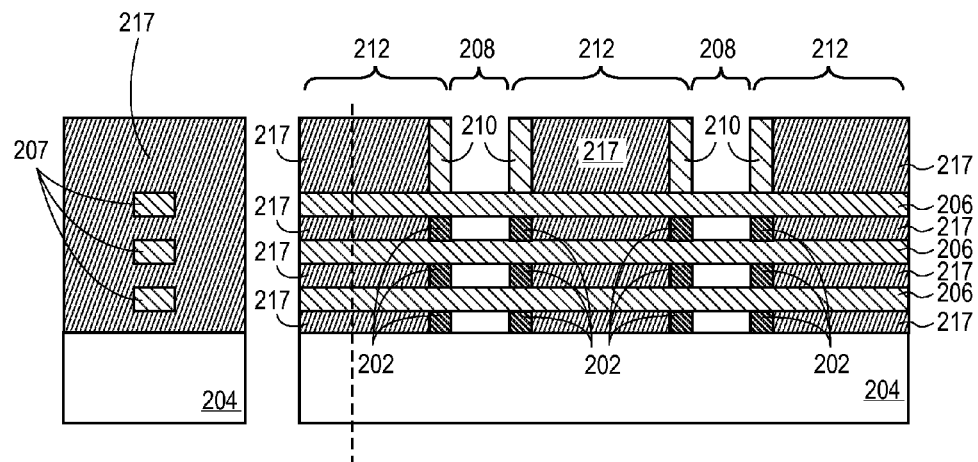

Next, in FIG. 2G, a process for forming a functional gate electrode (e.g., a replacement metal gate (RMG) process) is initiated, according to an embodiment of the invention. A dielectric material 217 is blanket deposited over the structure, filling the source/drain regions 212. Dielectric material 217 may be any suitable dielectric material, such as silicon dioxide, silicon oxy-nitride, or silicon nitride. The channel region is then opened by removing the sacrificial gate structure 222 to expose the channel portion of the nanowire stack within channel region 208. Sacrificial gate electrode 222 may be removed using a conventional etching method such a plasma dry etch or a wet etch. In an embodiment, a wet etchant such as a TMAH solution is used to selectively remove the sacrificial gate.

Next, the sacrificial material 220 is removed from the channel region 208, to expose the full perimeter of the channel portion of each nanowire 206, according to an embodiment. The removal of sacrificial material 220 leaves a void between adjacent nanowires 206. In an embodiment, sacrificial material 226 is etched to expose the surface of internal spacers 202. Sacrificial material 220 may be etched by any suitable process, as discussed above with respect to the etching of sacrificial material 220 from the source/drain regions 212. In an embodiment, the portion of substrate 204 underlying the bottommost nanowire 206 is removed in order to expose the full perimeter of the bottommost nanowire 206, as discussed above with respect to etching substrate 204 to expose the full perimeter of the source/drain portion of the bottommost nanowire 206.

Figure 2H:
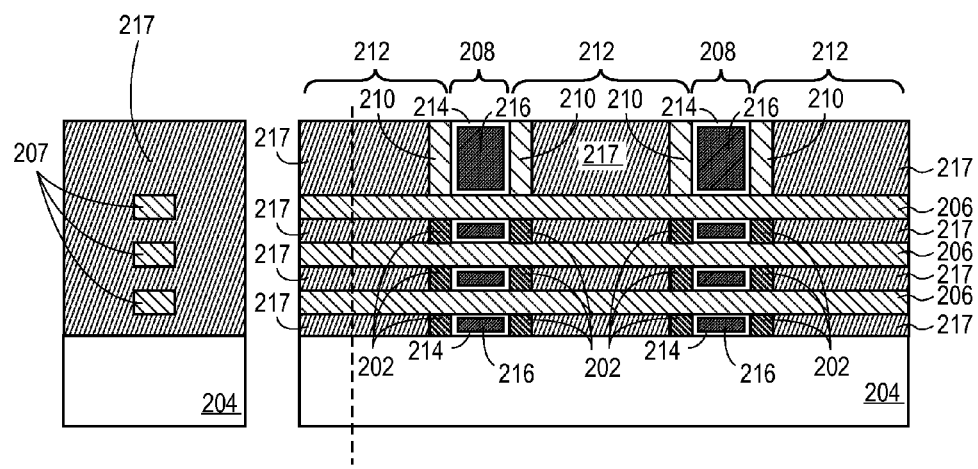

Then, as shown in FIG. 2H, a functional gate structure may be formed within the channel region 208, wrapping around the channel portion of each nanowire 206. The gate structure may comprise a gate dielectric layer 214 and gate electrode 216. In an embodiment, gate dielectric layer 214 is conformally deposited on all exposed surfaces within the channel region 208, including the exposed surface of the internal spacer 202. In an embodiment gate electrode 216 is formed over the gate dielectric layer 214, wrapping around the portion of each nanowire 206 within the channel region 208. Gate dielectric 214 and gate electrode 216 may be formed by any suitable deposition method that is conformal, for example, ALD.

In another embodiment, the RMG process is performed after deposition of spacer material 226, as shown in FIG. 2C. In an alternative embodiment, the RMG process is performed after the transformation of spacer material 226, as shown in FIG. 2D.

Additional processing steps may be performed to form a functioning device, such as forming source/drain contacts. Source/drain contacts may be formed in trenches etched in dielectric 217 to expose source/drain portions of nanowires 206. In an embodiment, source/drain contacts are formed from a metal species that wraps around the source/drain portions of nanowires 206. In another embodiment, homogeneous source/drain portions are formed as discussed above with respect to FIG. 1D. In a completed device, the internal spacers 202 isolate the functional gate structure from the source/drain region. In an embodiment, internal spacers 202 reduce overlap capacitance between the portions of gate electrode 216 internal to the nanowire stack and any adjacent conductive or semiconductive material within the source/drain region 212.

FIGS. 3A-3G are cross-sectional views of a method for forming a nanowire transistor 300 configured with internal spacers by opening the channel region of the device, according to an embodiment of the invention. Each figure illustrates two alternate cross-sectional views of the partially-formed nanowire transistor 300: one on the left taken through the channel region of the device, and one on the right taken parallel to the nanowires. The location of the left-hand channel view is illustrated by a dotted line on the right-hand view parallel to the nanowires.

Figures 1, 3A:
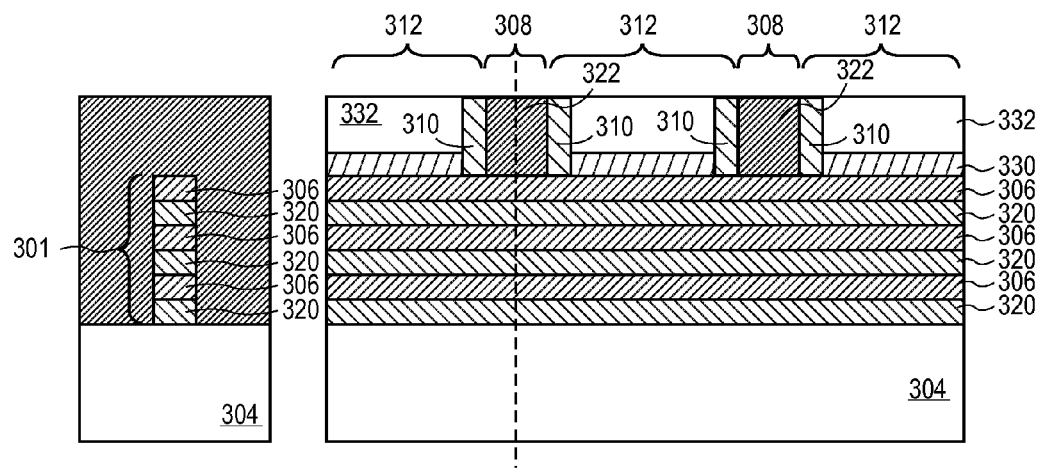
FIGS. 3A-3G illustrate two-dimensional cross-sectional views of a method for forming a nanowire device internal spacers according to an embodiment of the invention.
Figures 2, 3A:
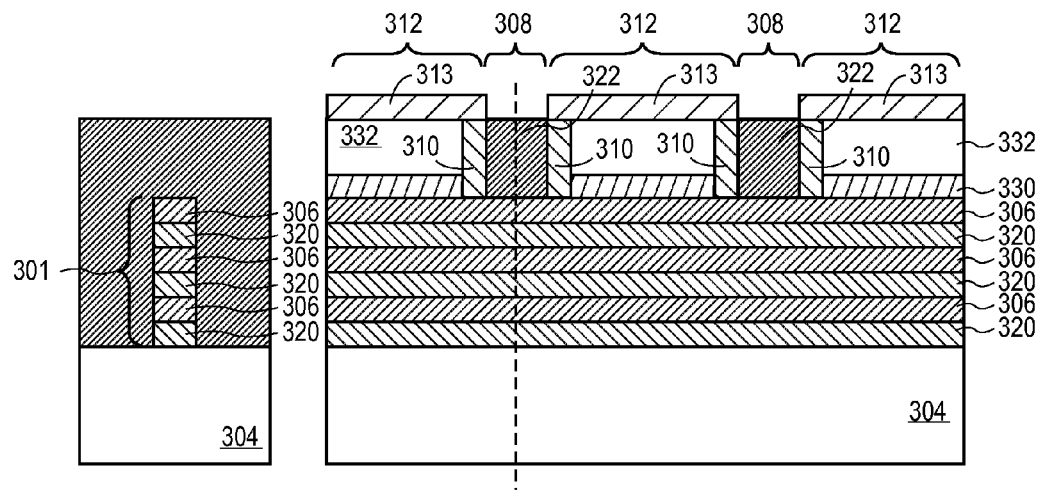

In FIG. 3A-1, a structure is provided having a nanowire stack 301 disposed above a substrate 304, a sacrificial gate structure 322 defining a channel region 308, external gate sidewall spacers 310 on the sidewalls of sacrificial gate structure 322, and source/drain regions 312 on opposite sides of the channel region 308. In an embodiment, source/drain regions 312 are covered by hardmask 330 and interlayer dielectric 332. Hardmask 330 may be any material suitable for protecting underlying nanowires from etching and doping processes. Interlayer dielectric 332 may be any known low-k dielectric material, such as silicon dioxide, silicon oxy-nitride, or silicon nitride. As illustrated in FIG. 3A-2, an optional reflective or opaque mask may be formed on the external spacers 310 and interlayer dielectric 332 to prevent electromagnetic radiation or particle beam from entering the external spacers 310.

Figure 3B:
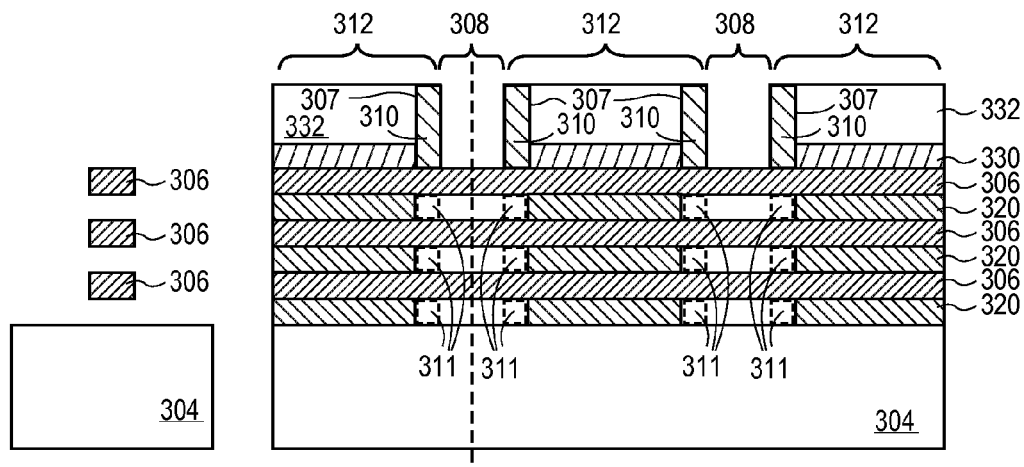

Next, as shown in FIG. 3B, nanowires 306 are exposed within the channel region 308, according to an embodiment of the invention. In an embodiment, the sacrificial gate structure 322 is first removed to expose the portion of the nanowire stack 301 within channel region 308. Sacrificial gate electrode 322 may be removed using a conventional etching method such a plasma dry etch or a wet etch. In an embodiment, a wet etchant such as a TMAH solution may be used to selectively remove the sacrificial gate.

Next, the sacrificial material 320 is removed from the channel region 308, to expose the full perimeter of each nanowire 306, according to an embodiment. The removal of sacrificial material 320 leaves a void between adjacent nanowires 306. In an embodiment, sacrificial material 326 is etched beyond the channel region 308 to partially extend into the source/drain region 312 in order to define dimples 311 in which the internal spacers will be formed. In an embodiment, dimples 311 are etched in alignment with surface 307 of external sidewall spacer 310. In an example embodiment, the dimple volume 311 is defined by the edge of the channel region 308, the interface of the internal and external regions of the nanowire stack, and the surfaces of two adjacent nanowires 306. In an embodiment, external sidewall spacer 310 wraps around nanowire stack 301 at the interface of the internal and external regions of the nanowire stack, in contact with dimple volumes 311. Sacrificial material 320 may be etched by any suitable process, as discussed above with respect to the etching of sacrificial material 220. In an embodiment, the portion of substrate 304 underlying the bottommost nanowire 306 is removed in order to expose the full perimeter of the bottommost nanowire 306, defining a dimple volume 311 below bottommost nanowire 306. Substrate 304 may be etched by any known process that is selective to substrate 304 material over nanowire 306 material.

Figure 3C:
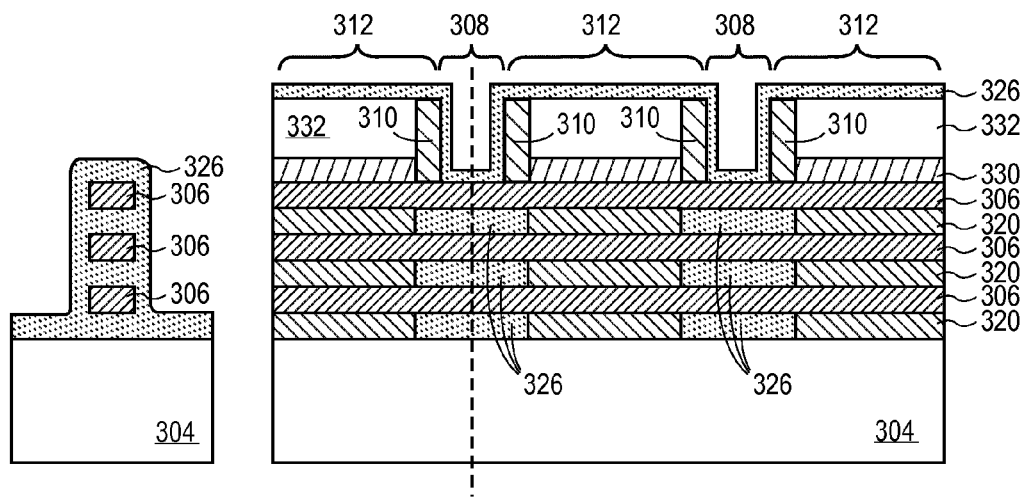

Referring to FIG. 3C, spacer material 326 is then formed over the exposed surfaces within the channel region 308 such that it fills the dimples 311, according to an embodiment of the invention. In an embodiment, spacer material 326 fills the entire channel region 308. According to an embodiment of the invention, spacer material 326 is formed from a positive-tone photo-definable dielectric material (PDDM) such as the materials disclosed above. Spacer material 326 may be formed by a spin-on wet deposition process well known in the art.

Figure 3D:
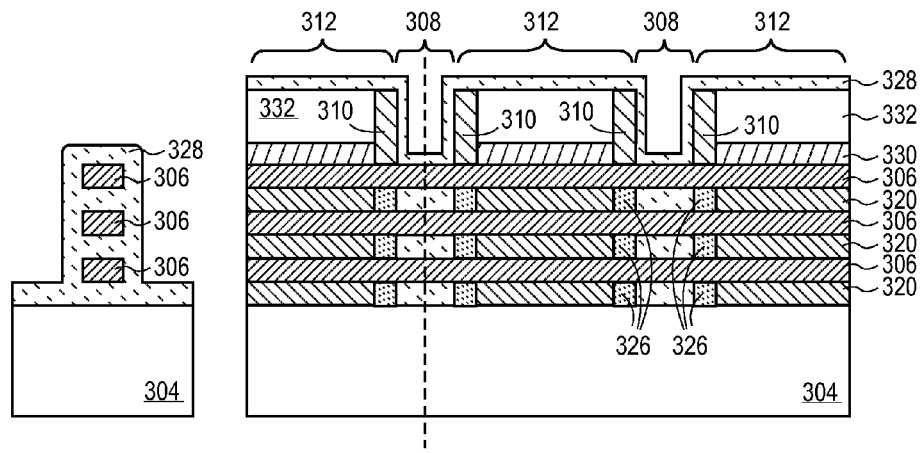

As shown in FIG. 3D, the spacer material 326 within the channel region 308, but not within the dimples 311, is then transformed to form transformed spacer material 328. In an embodiment, transformed spacer material 328 has a different etch selectivity than spacer material 326. By altering the etch selectivity of transformed spacer material 328 as compared to spacer material 326, the etch process to remove excess spacer material from outside the dimple 311 is more easily controlled. Transformation may occur by exposure to any form of electromagnetic radiation, such as, but not limited to, visible and ultraviolet light, or any form of particle beam, such as, but not limited to, ion beam and electron beam. In an embodiment, transformation occurs by a flood exposure of DUV light with a wavelength of 172 nm, 193 nm, or 248 nm. As above, the exposure angle may be perpendicular to the vertical edge of spacer 310 and at a sufficient altitudinal angle to expose the spacer material 206 under the nanowires 306. When the photo-definable spacer material 326 is exposed to electromagnetic radiation, the polarity of the spacer material 226 is changed to form a more soluble structure. In an embodiment, the transformed spacer material 328 becomes soluble in a developer solution while the un-transformed spacer material 326 remains insoluble in the developer solution. As such, the molecular structure of the transformed spacer material 328 enables it to be etched selectively to the un-transformed spacer material 326 located within the dimple volumes 311.

In an embodiment, external gate sidewalls spacers 310, or optional opaque/reflective mask 313 from FIG. 3A-2, protects the spacer material 326 within the dimple volumes 311 from exposure to electromagnetic radiation and/or particle beam. In an embodiment, insufficient electromagnetic radiation or particle beam passes through the external gate sidewall spacers 310 or optional opaque/reflective mask 313. As such, the transformation is self-aligned to prevent the spacer material 326 within the dimple volumes 311 from exposure. In an embodiment, the transformation process is sufficient to alter the etch selectivity of the spacer material 326 within the channel region, but does not affect mobility or degrade performance of the nanowires 306.

Figure 3E:
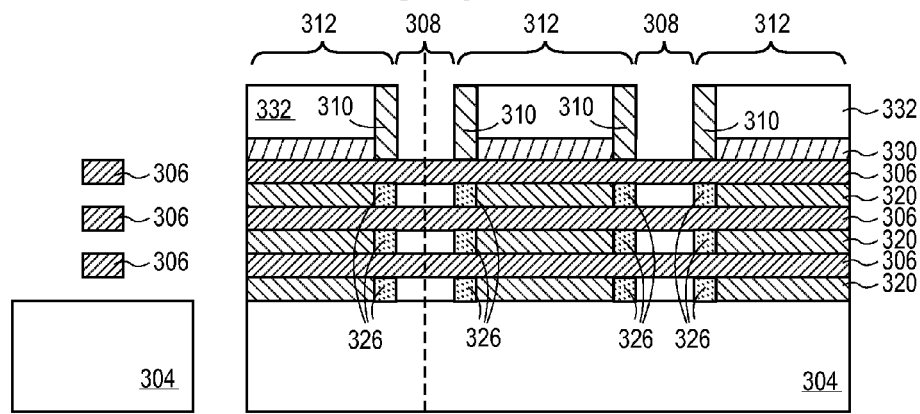

Next, in FIG. 3E, the transformed spacer material 328 is removed from within the channel region of the device. Transformed spacer material 328 may be removed by a wet-etch process selective to un-transformed spacer material 326. For example, a transformed spacer material 328 made from SSQ with a PAG additive may be removed selective to the un-transformed spacer material 326 by a developer such as alcohol. Other suitable developers are disclosed above.

Figure 3F:
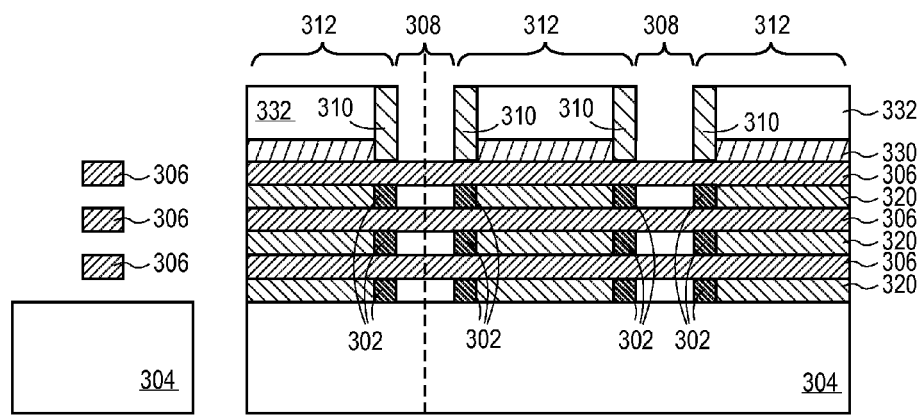

Then, as shown in FIG. 3F, the remaining un-transformed spacer material 326 may be cured to form an internal spacer 302. In an embodiment, curing of the spacer material 326 cross-links the photo-definable dielectric material and increases its molecular weight. As such, the cross-linked photo-definable dielectric material may remain as the internal spacer 302. In an embodiment, curing the spacer material 326 is performed by thermal treatment at a high temperature. In an embodiment, the spacer material 326 is cured at a temperature greater than 250° C. In a particular embodiment, the curing temperature is between 350 and 450° C. In an embodiment, ultraviolet (UV) light or ion beam (with off axis illumination) is introduced in the curing process to aid in cross-linking the photo-definable dielectric material. With the addition of UV light or ion beam, curing the temperature may be reduced.

Figure 3G:
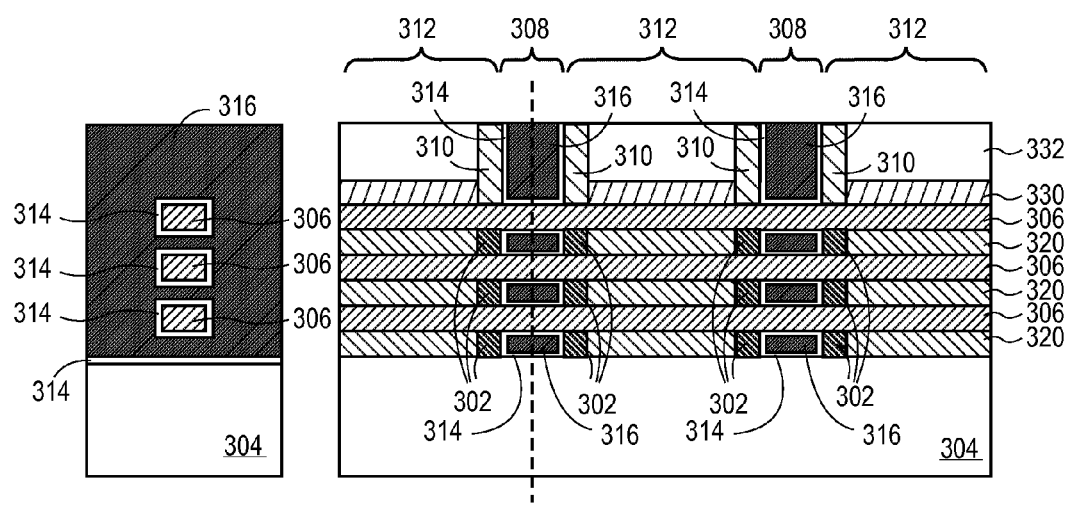

Next, in FIG. 3G, a functional gate structure may be formed within the channel region 308, wrapping around the portion of each nanowire 306. The gate structure may comprise a gate dielectric layer 314 and gate electrode 316. In an embodiment, gate dielectric layer 314 is conformally deposited on all exposed surfaces within the channel region 308, including the exposed surface of the internal spacer 302. In an embodiment gate electrode 316 is formed over the gate dielectric layer 314, wrapping around the portion of each nanowire 306 within the channel region 308. Gate dielectric 314 and gate electrode 316 may be formed by any suitable deposition method that is conformal, for example, ALD.

Additional processing steps may then be performed to form a functioning device, such as forming source/drain contacts. Source/drain contacts may be formed in trenches etched to expose the full perimeter of source/drain portions of nanowires 306. In an embodiment, source/drain contacts are formed from a metal species that wraps around the source/drain portions of nanowires 306. In another embodiment, homogeneous source/drain portions are formed as discussed above with respect to FIG. 1D. In a completed device, the internal spacers 302 isolate the functional gate structure from the source/drain region. In an embodiment, internal spacers 302 reduce overlap capacitance between the portions of gate electrode 316 internal to the nanowire stack and any adjacent conductive or semiconductive material within the source/drain region 312.

Figure 4:
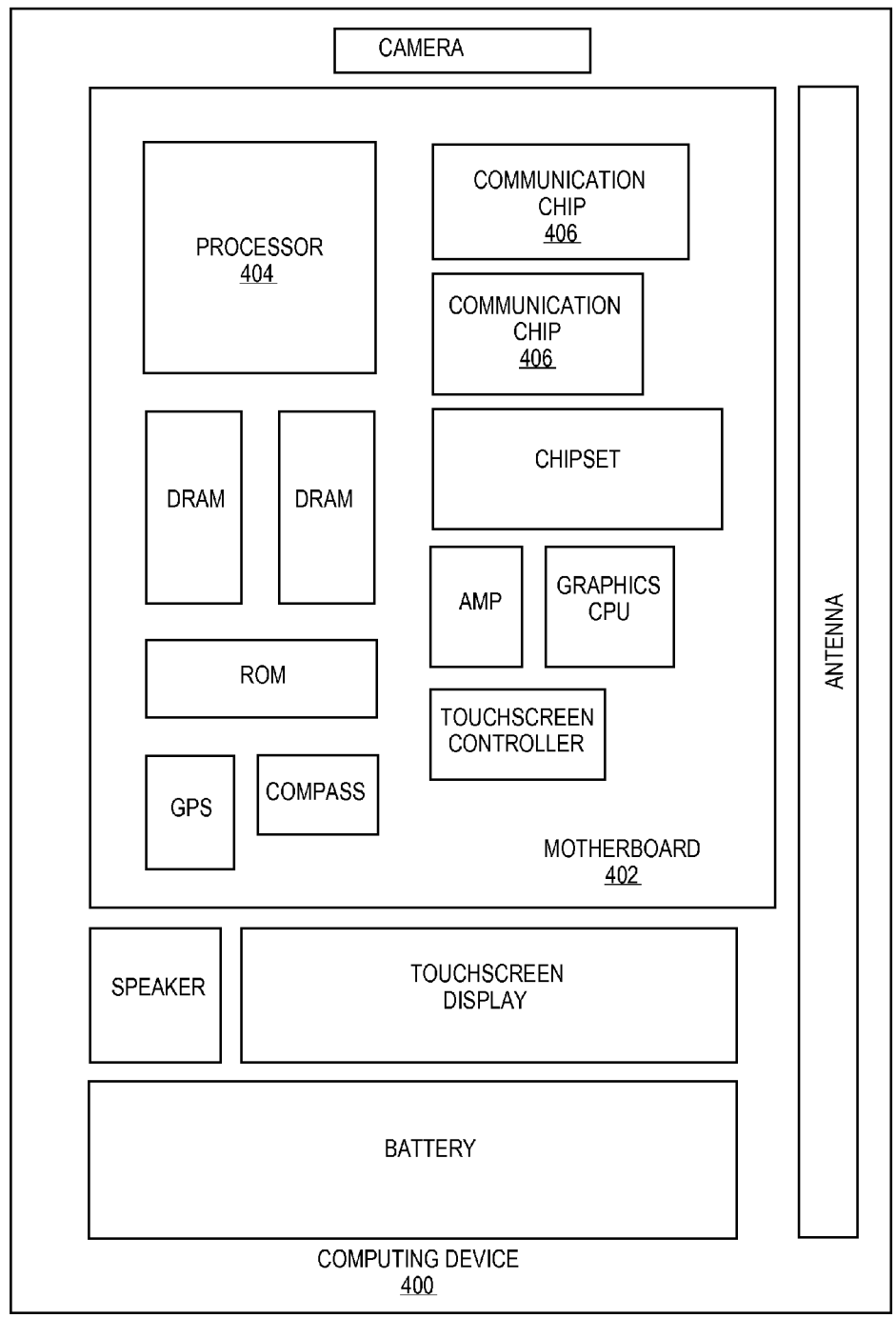
FIG. 4 illustrates a computing device in accordance with one embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more gate all-around transistors having a plurality of internal gate sidewall spacers, in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more gate all-around transistors having a plurality of internal gate sidewall spacers, in accordance with implementations of the invention.

In further implementations, another component housed within the computing device 400 may contain an integrated circuit die that includes one or more gate all-around transistors having a plurality of internal gate sidewall spacers, in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

In an embodiment, a semiconductor device comprises a nanowire stack disposed above a substrate, the nanowire stack having a plurality of vertically-stacked nanowires; a gate structure wrapped around each of the plurality of nanowires, defining a channel region of the device, the gate structure having gate sidewalls; an external spacer on a portion of the gate sidewalls above the nanowire stack; a pair of source/drain regions on opposite sides of the channel region; and an internal spacer on a portion of the gate sidewalls between two adjacent nanowires, internal to the nanowire stack, the internal spacer comprising a photo-definable dielectric material. In an alternative embodiment, the photo-definable dielectric material is cross-linked. In another embodiment, the photo-definable dielectric material comprises a silsesquioxane (SSQ) base resist and a photo destructive base. In yet another embodiment, the photo destructive base is paired with a photoacid generator (PAG). In an embodiment, the photo destructive base comprises the conjugate base of an organic acid as the anion and a photoactive cation. In one embodiment, the activity of the photo destructive base is enhanced by adding additional functional groups to the anion such as amine or alcohol. Furthermore, in an embodiment, the semiconductor device further comprises internal spacers on each portion of the gate sidewalls underneath the bottom nanowire in the nanowire stack. In one embodiment, the internal spacers isolate the source/drain contacts from the portion of the gate structure sidewall internal to the nanowire stack. Additionally, in an embodiment, the external spacer has a first thickness normal to the surface of the gate sidewall, wherein the internal spacers have a second thickness normal to the gate sidewall, and wherein the second thickness is equal to the first thickness. Moreover, in an embodiment, the source/drain regions of the device comprise a source/drain portion of the nanowires. In one embodiment, the source/drain regions of the device comprise a homogeneous semiconductor material.

In an embodiment, a method for forming internal spacers of a semiconductor device comprises providing a structure having a nanowire stack disposed above a substrate, the nanowire stack having a plurality of vertically-stacked nanowires separated by sacrificial material; a gate structure defining a channel region of the device; a pair of external spacers on opposite sides of the gate structure; and a pair of source/drain regions on opposite sides of the channel region; forming an opening by removing the gate structure and the sacrificial material directly below the gate structure; forming a dimple by removing the sacrificial material between the nanowires in the source/drain region and below the pair of external spacers; filling the opening and the dimple with a photo-definable dielectric material; modifying the photo-definable dielectric material in the opening; and removing the modified photo-definable dielectric material in the opening with a wet developer such that a portion of the photo-definable dielectric material remains in the dimple. In an embodiment, the method further comprises forming a mask above the external spacers. Furthermore, in an embodiment, the mask comprises an optically opaque material.

In one embodiment, the optically opaque material is a material selected from the group consisting of a nitride and a carbide. In an embodiment, the mask comprises an optically reflective material. Additionally, in an embodiment, the optically reflective material is titanium nitride. Moreover, in an embodiment, modifying the photo-definable dielectric material is a chemical modification performed by exposure to electromagnetic radiation with off axis illumination. In an embodiment, the electromagnetic radiation is visible light. In one embodiment, the electromagnetic radiation is ultraviolet light. Furthermore, in an embodiment, modifying the photo-definable dielectric material is a chemical modification performed by exposure to particle beam with off axis illumination. Additionally, in an embodiment, the particle beam is an ion beam. In one embodiment, the particle beam is an electron beam. In an embodiment, the dimples are etched in alignment with the external spacers. Moreover, in an embodiment, filling the dimples with spacer material comprises a wet spin-on of photo-definable spacer material on the exposed nanowire surfaces. In an embodiment, the method further comprises transforming the photo-definable spacer material within the channel region, wherein transforming the spacer material comprises altering the etch selectivity of the spacer material by changing its molecular polarity. Additionally, in an embodiment, the method further comprises curing the photo-definable dielectric material at a temperature greater than 250° C. In one embodiment, curing the photo-definable dielectric material comprises ultraviolet (UV) light exposure. In an embodiment, curing the photo-definable dielectric material comprises ion beam exposure.

Although implementations of the invention have been described with reference to specific embodiments, it will be understood by those skilled in the art that various changes may be made without departing from the spirit or scope of embodiments of the invention. Accordingly, the disclosure of embodiments of the invention is intended to be illustrative of the scope of embodiments of the invention and is not intended to be limiting. It is intended that the scope of embodiments of the invention shall be limited only to the extent required by the appended claims. For example, to one of ordinary skill in the art, it will be readily apparent that the internal spacers and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor device, comprising:
   a nanowire stack disposed above a substrate, the nanowire stack having a plurality of vertically-stacked nanowires;
   a gate structure wrapped around each of the plurality of nanowires, defining a channel region of the device, the gate structure having gate sidewalls;
   an external spacer on a portion of the gate sidewalls above the nanowire stack, wherein the external spacer is opaque;
   a pair of source/drain regions on opposite sides of the channel region; and
   an internal spacer on a portion of the gate sidewalls between two adjacent nanowires, internal to the nanowire stack, the internal spacer comprising a photo-definable dielectric material.

2. The semiconductor device of claim 1, wherein the photo-definable dielectric material is cross-linked.

3. The semiconductor device of claim 2, wherein the photo-definable dielectric material comprises a silsesquioxane (SSQ) base resist and a photo destructive base.

4. The semiconductor device of claim 3, wherein the photo destructive base is paired with a photoacid generator (PAG).

5. The semiconductor device of claim 3, wherein the photo destructive base comprises the conjugate base of an organic acid as the anion and a photoactive cation.

6. The semiconductor device of claim 5, wherein the activity of the photo destructive base is enhanced by adding additional functional groups to the anion such as amine or alcohol.

7. The semiconductor device of claim 1, wherein the external spacer has a first thickness normal to the surface of the gate sidewall, wherein the internal spacers have a second thickness normal to the gate sidewall, and wherein the second thickness is equal to the first thickness.

8. A method for forming internal spacers of a semiconductor device, comprising:
   providing a structure having:
      a nanowire stack disposed above a substrate, the nanowire stack having a plurality of vertically-stacked nanowires separated by sacrificial material;
      a gate structure defining a channel region of the device;
      a pair of external spacers on opposite sides of the gate structure, wherein the pair of external spacers is opaque; and
      a pair of source/drain regions on opposite sides of the channel region;
   forming an opening by removing the gate structure and the sacrificial material directly below the gate structure;
   forming a dimple by removing the sacrificial material between the nanowires in the source/drain region and below the pair of external spacers;
   filling the opening and the dimple with a photo-definable dielectric material;
   modifying the photo-definable dielectric material in the opening; and
   removing the modified photo-definable dielectric material in the opening with a wet developer such that a portion of the photo-definable dielectric material remains in the dimple.

9. The method of claim 8, further comprising forming a mask above the external spacers.

10. The method of claim 9, wherein the mask comprises an optically opaque material.

11. The method of claim 10, wherein the optically opaque material is a material selected from the group consisting of a nitride and a carbide.

12. The method of claim 9, wherein the mask comprises an optically reflective material.

13. The method of claim 12, wherein the optically reflective material is titanium nitride.

14. The method of claim 8, wherein modifying the photo-definable dielectric material is a chemical modification performed by exposure to electromagnetic radiation with off axis illumination.

15. The method of claim 14, wherein the electromagnetic radiation is visible light.

16. The method of claim 14, wherein the electromagnetic radiation is ultraviolet light.

17. The method of claim 8, wherein modifying the photo-definable dielectric material is a chemical modification performed by exposure to particle beam with off axis illumination.

18. The method of claim 17, wherein the particle beam is an ion beam.

19. The method of claim 17, wherein the particle beam is an electron beam.

20. The method of claim 8, wherein the dimples are etched in alignment with the external spacers.

21. The method of claim 8, wherein filling the dimples with spacer material comprises a wet spin-on of photo-definable spacer material on the exposed nanowire surfaces.

22. The method of claim 21, further comprising transforming the photo-definable spacer material within the channel region, wherein transforming the spacer material comprises altering the etch selectivity of the spacer material by changing its molecular polarity.

23. The method of claim 8, further comprising curing the photo definable dielectric material at a temperature greater than 250° C.

24. The method of claim 23, wherein curing the photo-definable dielectric material comprises ultraviolet (UV) light exposure.

25. The method of claim 23, wherein curing the photo-definable dielectric material comprises ion beam exposure.

26. A method for forming internal spacers of a semiconductor device, comprising:
   providing a structure having:
      nanowire stack disposed above a substrate, the nanowire stack having a plurality of vertically-stacked nanowires separated by sacrificial material;
      a gate structure defining a channel region of the device;
      a pair of external spacers on opposite sides of the gate structure; and
      a pair of source/drain regions on opposite sides of the channel region;
   forming a mask above the external spacers;
   forming an opening by removing the gate structure and the sacrificial material directly below the gate structure;
   forming a dimple by removing the sacrificial material between the nanowires in the source/drain region and below the pair of external spacers;
   filling the opening and the dimple with a photo-definable dielectric material;
   modifying the photo-definable dielectric material in the opening; and
   removing the modified photo-definable dielectric material in the opening with a wet developer such that a portion of the photo-definable dielectric material remains in the dimple.

27. The method of claim 26, wherein the mask comprises an optically opaque material.

28. The method of claim 27, wherein, the optically opaque material is a material selected from the group consisting of a nitride and a carbide.

29. The method of claim 26, wherein the mask comprises an optically reflective material.

30. The method of claim 29, wherein the optically reflective material is titanium nitride.

* * * * *